United States Patent
Yang et al.

(10) Patent No.: US 8,748,249 B2
(45) Date of Patent: Jun. 10, 2014

(54) VERTICAL STRUCTURE NON-VOLATILE MEMORY DEVICE AND METHOD OF MANUFACTURING THE SAME

(75) Inventors: Jun-kyu Yang, Seoul (KR); Ki-hyun Hwang, Seongnam-si (KR); Phil-ouk Nam, Hwaseong-si (KR); Jae-young Ahn, Seongnam-si (KR); Han-mei Choi, Seocho (KR); Dong-chul Yoo, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 49 days.

(21) Appl. No.: 13/456,415

(22) Filed: Apr. 26, 2012

(65) Prior Publication Data

US 2012/0276696 A1    Nov. 1, 2012

(30) Foreign Application Priority Data

Apr. 29, 2011 (KR) .................. 10-2011-0040973

(51) Int. Cl.
*H01L 21/8238* (2006.01)
(52) U.S. Cl.
USPC .... 438/201; 438/211; 438/257; 257/E21.179; 257/E21.422; 257/E21.68
(58) Field of Classification Search
USPC .......... 438/201, 211, 257, 593; 257/E21.179, 257/E21.422, E21.68
See application file for complete search history.

(56) References Cited

U.S. PATENT DOCUMENTS

2012/0139027 A1* 6/2012 Son et al. ............... 257/324

FOREIGN PATENT DOCUMENTS

| KR | 10200800705883 | 7/2008 |
|---|---|---|
| KR | 1020100028827 | 3/2010 |
| KR | 1020100034612 | 4/2010 |
| KR | 1020100079393 | 7/2010 |

* cited by examiner

*Primary Examiner* — Hoai V Pham
(74) *Attorney, Agent, or Firm* — F. Chau & Associates, LLC

(57) ABSTRACT

A vertical structure non-volatile memory device in which a gate dielectric layer is prevented from protruding toward a substrate; a resistance of a ground selection line (GSL) electrode is reduced so that the non-volatile memory device is highly integrated and has improved reliability, and a method of manufacturing the same are provided. The method includes: sequentially forming a polysilicon layer and an insulating layer on a silicon substrate; forming a gate dielectric layer and a channel layer through the polysilicon layer and the insulating layer, the gate dielectric layer and the channel layer extending in a direction perpendicular to the silicon substrate; forming an opening for exposing the silicon substrate, through the insulating layer and the polysilicon layer; removing the polysilicon layer exposed through the opening, by using a halogen-containing reaction gas at a predetermined temperature; and filling a metallic layer in the space formed by removing the polysilicon layer.

19 Claims, 14 Drawing Sheets

VERTICAL STRUCTURE NON-VOLATILE MEMORY DEVICE AND METHOD OF MANUFACTURING THE SAME

CROSS-REFERENCE TO RELATED APPLICATIONS

This application claims the benefit of Korean Patent Application No. 10-2011-0040973, filed on Apr. 29, 2011, in the Korean Intellectual Property Office, the disclosure of which is incorporated by reference herein in its entirety.

TECHNICAL FIELD

The inventive concept relates to a vertical structure non-volatile memory device and a method of manufacturing the same, and more particularly, to a vertical structure non-volatile memory device including a ground selection line (GSL) electrode with a low resistance and a method of manufacturing the same.

SUMMARY

In an embodiment the inventive concept provides a non-volatile memory device having a vertical structure in which a gate dielectric layer is prevented from protruding toward a substrate and a resistance of a ground selection line (GSL) electrode is reduced so that the vertical structure non-volatile memory device is highly integrated and has improved reliability. In an embodiment the inventive concept provides a method of manufacturing the same.

According to an embodiment of the inventive concept, a method of manufacturing a vertical structure non-volatile memory device is provided; the method includes: forming a first sacrificial layer on a substrate; alternately stacking insulating layers and second sacrificial layers having different etch selectivities with respect to the first sacrificial layer, on the first sacrificial layer; forming a first middle opening for exposing the first sacrificial layer through the second sacrificial layers and the insulating layers; forming a first opening for exposing a first portion of the substrate, by etching the first exposed sacrificial layer; forming a gate dielectric layer on sidewalls and a bottom surface of the first opening; forming a channel layer that is electrically connected to the substrate, on the gate dielectric layer; forming a second opening to be separated from the first opening, the second opening exposing a second portion of the substrate through the insulating layers and the first sacrificial layer; removing the second sacrificial layers exposed through the second opening; removing the first sacrificial layer exposed through the second opening; and filling a conductive material layer in a space formed by removing the first sacrificial layer and the second sacrificial layers;

Before the forming of the first sacrificial layer, the method may further include forming a middle temperature oxide (MTO) buffer layer on the substrate. The first sacrificial layer may be formed of polysilicon, and the second sacrificial layers may be formed of nitride layers or oxide layers, and the insulating layers may be formed of oxide layers or nitride layers having different etch selectivities with respect to the first sacrificial layer and the second sacrificial layers.

The first sacrificial layer may be removed using a halogen-containing reaction gas. The halogen-containing reaction gas may include one gas selected from the group consisting of $Cl_2$, $NF_3$, $ClF_3$, and $F_2$ gases. The first sacrificial layer may be removed by performing a plasma-less thermal etch process.

The plasma-less thermal etch process may be performed at a temperature lower than 500° C.

In an embodiment, the bottom surface of the gate dielectric layer may form the same plane as a top surface of the substrate.

In an embodiment, the forming of the channel layer may include: forming a first semiconductor material layer on the gate dielectric layer; forming a spacer on sides of the first semiconductor material layer; exposing the substrate by etching bottom surfaces of the first semiconductor material layer and the gate dielectric layer by using the spacer as a mask; removing the spacer; and forming a second semiconductor material layer for connecting the first semiconductor material layer and the substrate. The forming of the channel layer may include: forming a first semiconductor material layer on the gate dielectric layer; exposing the substrate by anisotropically etching bottom surfaces of the first semiconductor material layer and the gate dielectric layer; and forming a second semiconductor material layer for connecting the first semiconductor material layer and the substrate.

In an embodiment, the forming of the second opening may include etching an upper portion of the substrate by over etching, and the conductive material layer may be formed of a metallic material, and the conductive material layer filled in a space formed by removing the first sacrificial layer, may be a gate of a ground selection transistor.

According to an embodiment of the inventive concept, a method of manufacturing a vertical structure non-volatile memory device is provided, the method includes: sequentially forming a polysilicon layer and a plurality of insulating layers on a silicon substrate; forming a gate dielectric layer and a channel layer through the polysilicon layer and the plurality of insulating layers, the gate dielectric layer and the channel layer extending in a direction perpendicular to a top surface of the silicon substrate; forming an opening for exposing the silicon substrate, through the polysilicon layer and the plurality of insulating layers; removing the polysilicon layer exposed through the opening, by using a halogen-containing reaction gas less than or equal to a predetermined temperature; and filling a metallic layer in a space formed by removing the polysilicon layer.

In an embodiment, sequentially forming the polysilicon layer and the plurality of insulating layers may include alternately stacking insulating layers and sacrificial layers on the polysilicon layer, and before the step of removing of the polysilicon layer, the method may further include removing the sacrificial layers exposed through the opening.

In an embodiment, halogen-containing reaction gas may include one or more gases selected from the group consisting of $Cl_2$, $NF_3$, $ClF_3$, and $F_2$, and the predetermined temperature may be 500° C.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
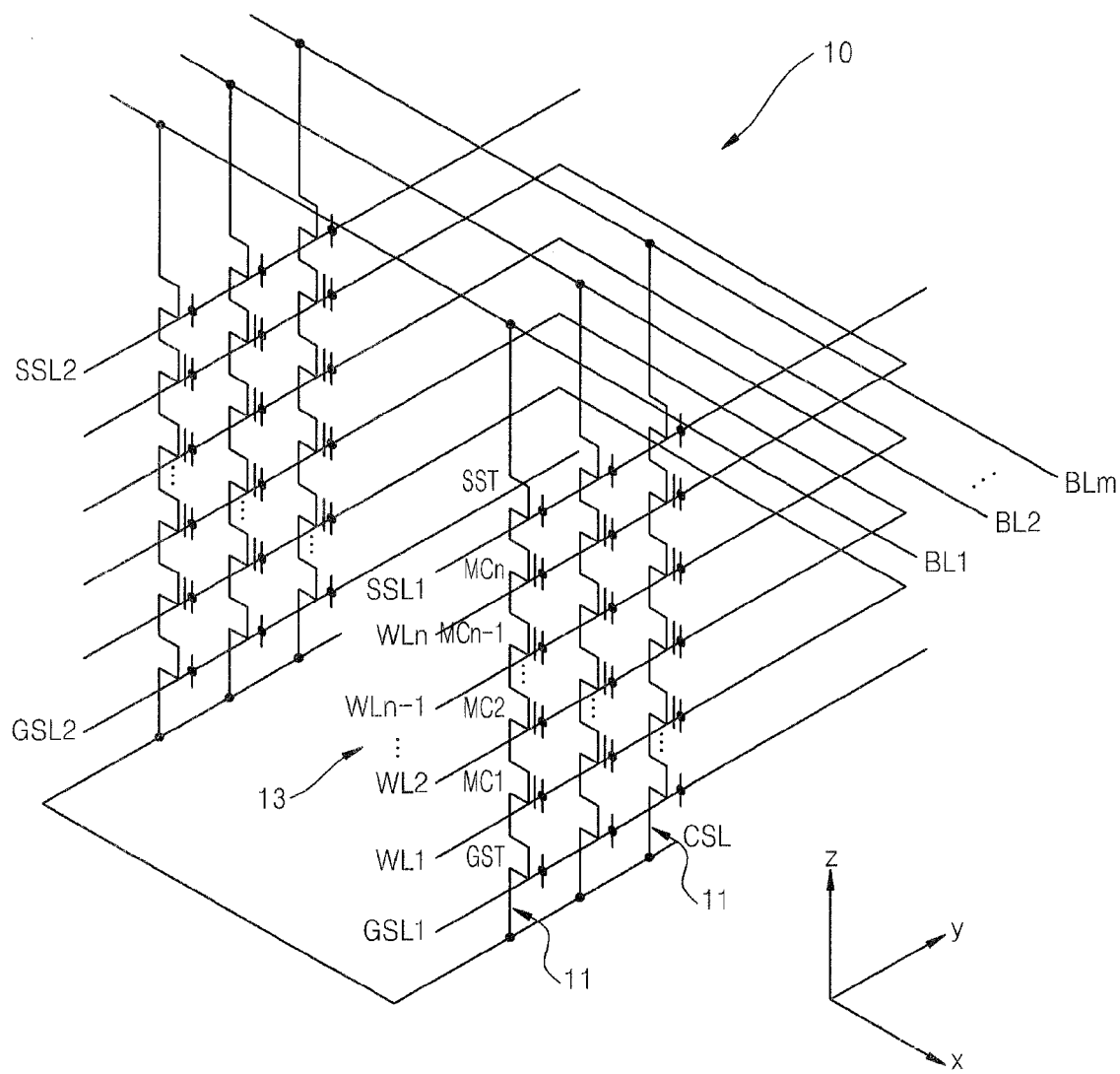
FIG. 1 is an equivalent circuit diagram of a memory cell array of a non-volatile memory device, according to an embodiment of the inventive concept.

Example embodiments of the inventive concept will be described more fully with reference to the accompanying drawings. The inventive concept may, however, be embodied in many different forms and should not be construed as being limited to the exemplary embodiments set forth herein.

In the drawings, for example, illustrated shapes may be deformed according to fabrication technology and/or tolerances. Therefore, the exemplary embodiments of the inventive concept are not limited to certain shapes illustrated in the present specification, and may include modifications of shapes caused in fabrication processes. Like reference numerals refer to like elements. Furthermore, various elements and regions in the drawings are schematically drawn. Thus, the inventive concept is not limited by relative sizes or distances in the drawings. Meanwhile, the terms are used not for limiting meanings of the terms or the scope of the inventive concept recited in the claims but for describing the inventive concept.

A non-volatile memory device according to an embodiment of the inventive concept may include a cell array region, a peripheral circuit region, a sense amplifier region, a decoding circuit region, and a connection region. In the cell array region, a plurality of memory cells, and a plurality of bitlines and a plurality of wordlines to be electrically connected to the memory cells are disposed. In the peripheral circuit region, circuits for driving the memory cells are disposed. In the sense amplifier region, circuits for reading information stored in the memory cells are disposed. The connection region may be disposed between the cell array region and the decoding circuit region. In the connection region, a wiring structure for electrically connecting the wordlines and the decoding circuit region may be disposed.

FIG. 1 is an equivalent circuit diagram of a memory cell array of a non-volatile memory device, according to an embodiment of the inventive concept. FIG. 1 illustrates an equivalent circuit diagram of a NAND flash memory device having a vertical structure, in particular, a vertical channel structure.

Referring to FIG. 1, a memory cell array 10 may include a plurality of memory cell strings 11. Each of the plurality of memory cell strings 11 may have a vertical structure in which the memory cell strings 11 extend in a direction (i.e., z-direction) perpendicular to directions (i.e., x- and y-directions) in which a main surface of a substrate (not shown) extends. A memory cell block 13 may be formed by the plurality of memory cell strings 11.

Each of the memory cell strings 11 may include a plurality of memory cells MC1 to MCn, a string selection transistor SST, and a ground selection transistor GST. In each memory cell string 11, the ground selection transistor GST, the plurality of memory cells MC1 to MCn, and the string selection transistor SST may be disposed in series in the vertical direction, i.e., the z-direction. Here, the memory cells MC1 to MCn may store data. A plurality of wordlines WL1 to WLn are connected to the memory cells MC1 to MCn, respectively, controlling the memory cells MC1 to MCn connected thereto, respectively. The number of memory cells MC1 to MCn may be changed according to the capacity of the semiconductor memory device.

A plurality of bitlines BL1 to BLm extending in the x-direction may be connected to one side of each of the memory cell strings 11 arranged in first through m-th columns of the memory cell block 13, for example, a drain of the string selection transistor SST. In addition, a common source line CSL may be connected to the other side of each memory cell string 11, for example, a source of the ground selection transistor GST.

The wordlines WL1 to WLn that extend in the y-direction may be commonly connected to gates of the memory cells MC1 to MCn of the memory cell strings 11 arranged on the same layer. By driving the wordlines WL1 to WLn, data may be programmed on, read from, or erased from the memory cells MC1 to MCn.

In each memory cell string 11, the string selection transistor SST may be arranged between the bitlines BL1 to BLm and the memory cells MC1 to MCn. In the memory cell block 13, each string selection transistor SST may control data transmission between the bitlines BL1 to BLm and the memory cells MC1 to MCn by using the string selection line SSL connected to a gate of each string selection transistor SST.

The ground selection transistor GST may be arranged between the memory cells MC1 to MCn and the common source line CSL. In the memory cell block 13, each ground selection transistor GST may control data transmission between the memory cells MC1 to MCn and the common source line CSL by using the ground selection line GSL connected to a gate of each ground selection transistor GST.

Figure 2:
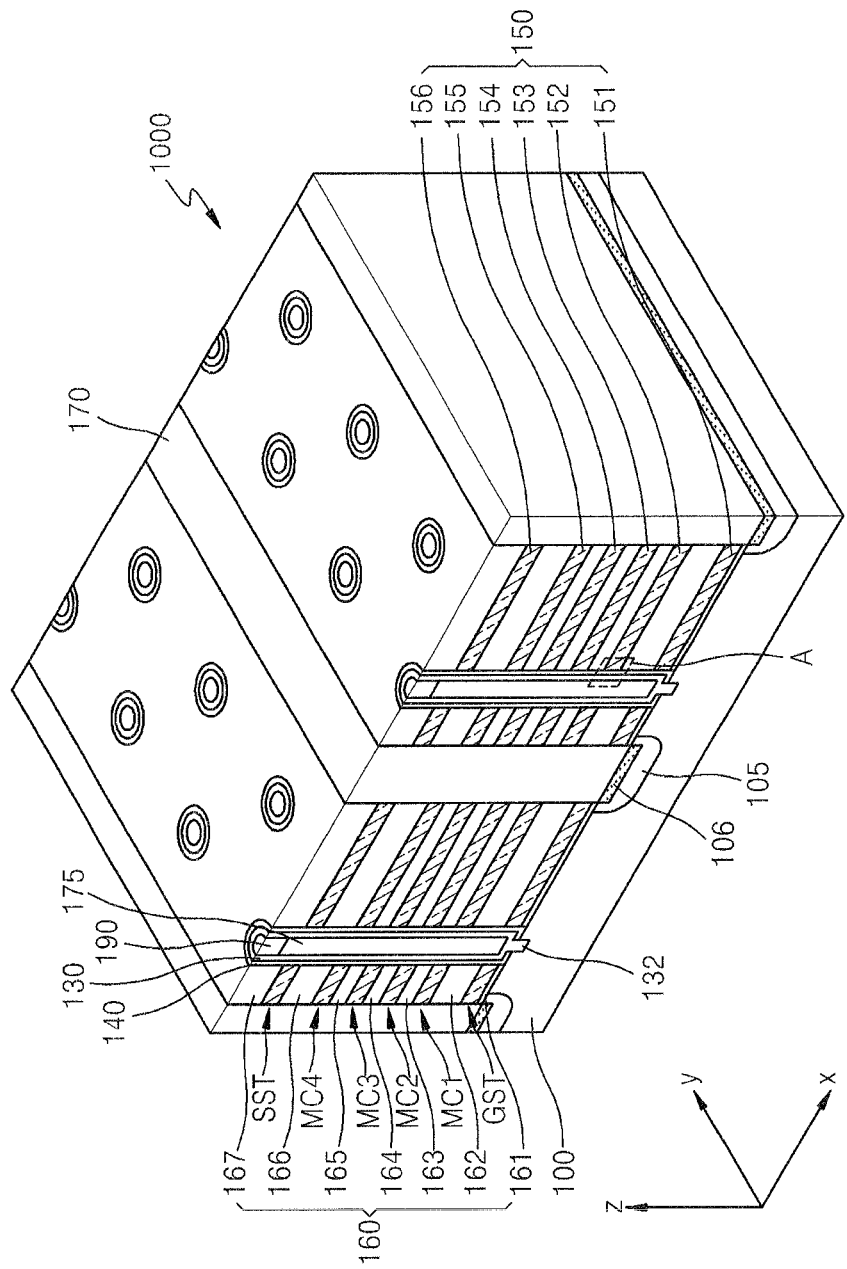
FIG. 2 is a schematic perspective view of a three-dimensional (3D) structure of memory cell strings of a non-volatile memory device, according to an embodiment of the inventive concept.

FIG. 2 is a schematic perspective view of a three-dimensional (3D) structure of memory cell strings of a non-volatile memory device 1000, according to an embodiment of the inventive concept. In FIG. 2, some elements that constitute the memory cell string 11 of FIG. 1 are omitted and not shown. For example, the bitlines BL1 to BLm connected to one side of each memory cell string 11 are omitted.

Referring to FIG. 2, the non-volatile memory device 1000 may include a channel region 130 disposed on a substrate 100 and the memory cell strings (see 11 of FIG. 1) disposed along sides of the channel region 130. The plurality of memory cell strings 11 of FIG. 1 may be arranged in the y-direction. As illustrated in FIG. 2, the memory cell strings 11 of FIG. 1 that extend from the substrate 100 in the z-direction may be arranged along the sidewalls of the channel region 130. Each memory cell string 11 of FIG. 1 may include a ground selection transistor GST, a plurality of memory cells MC1, MC2, MC3, and MC4, and a string selection transistor SST. If desired, two ground selection transistors GST and two string selection transistors SST may be disposed.

The main surface of the substrate 100 may extend in the x-direction and the y-direction. The substrate 100 may include a semiconductor material, for example, a Group IV semiconductor, a Group III-V compound semiconductor, or a Group II-VI oxide semiconductor. For example, the Group IV semiconductor may be silicon, germanium, or silicon-germanium. The substrate 100 may also be a bulk wafer or an epitaxial layer.

In an embodiment of the inventive concept, the channel regions 130 are shaped as a pillar and may be disposed on the substrate 100 to extend in the z-direction. The channel regions 130 may be disposed separately from each other in the x-direction and in the y-direction and may be disposed in a zig-zag form in the y-direction. In other words, the channel regions 130 arranged adjacent to each other in the y-direction may be offset in the x-direction. In addition, according to the inventive concept, the channel regions 130 are offset for every two columns. However, the inventive concept is not limited thereto, and the channel regions 130 may be arranged in various structures. For example, the channel regions 130 may be disposed in one column in the y-direction or may be offset for every three or more columns and may be disposed in a zig-zag form.

The channel regions 130 may have an annular shape, for example. However, the shape of the channel regions 130 is not limited to the annular shape, and the channel regions 130 may be shaped as a circular cylinder or a square pillar or may be formed only at both sides and a lower surface of a square pillar.

The bottom surfaces of the channel regions 130 may be electrically connected to the substrate 100. For example, the channel regions 130 may include contact portions that protrude from their lower surfaces and may be connected to the substrate 100 via the contact portions, as illustrated in FIG. 2. In addition, all lower surfaces of the channel regions 130 may be connected to the substrate 100.

Each of the channel regions 130 may include a semiconductor material such as polysilicon or single crystalline silicon. The semiconductor material may include a p-type or n-type impurity or may not be doped. A buried insulating layer 175 having a circular cylinder-shaped filler structure may be formed in the channel region 130. In an embodiment of the inventive concept shown in FIG. 2, the channel regions 130 arranged adjacent to each other with an insulating region 170 interposed between the channel regions 130 are asymmetrically disposed about the insulating region 170. However, the spirit of the inventive concept is not limited thereto. For example, the channel regions 130 arranged adjacent to each other with the insulating region 170 interposed between the channel regions 130 may be symmetrically disposed.

A conductive layer 190 may be formed on a top surface of the buried insulating layer 175 and may be electrically connected to the channel region 130. The conductive layer 190 may include doped polysilicon. The conductive layer 190 may act as a drain region of the string selection transistor SST.

String selection transistors SST arranged in the x-direction may be connected to bitlines BL1 to BLm (not shown) via the conductive layer 190. The bitlines BL1 to BLm (not shown) may be formed in a pattern of a line that extends in the x-direction, and the conductive layer 190 may be electrically connected to the bitlines BL1 to BLm via a bitline contact plug (not shown) formed on the conductive layer 190. In addition, the ground selection transistors GST arranged in the x-direction may be electrically connected to impurity regions 105 adjacent to the ground selection transistors GST.

The impurity regions 105 may be adjacent to the main surface of the substrate 100, may extend in the y-direction, and may be arranged separate from each other in the x-direction. One impurity region 105 may be arranged for each of the channel regions 130 in the x-direction. The impurity regions 105 may be source regions and may form PN junctions with other regions of the substrate 100. The impurity regions 105 may include a high-concentration impurity region (not shown) adjacent to the main surface of the substrate 100 and disposed in the center of the impurity regions 105, and a low-concentration impurity region (not shown) disposed on sides of the high-concentration impurity region.

A common source line CSL 106 may be formed on the impurity regions 105. The common source line CSL 106 may be formed of metal silicide, for example, cobalt silicide (CoSix). In addition, the common source line CSL 106 may include metal silicide and a metallic layer formed on metal silicide. Here, the metallic layer may be formed of tungsten (W), aluminum (Al), copper (Cu), or the like. The common source line CSL 106 according to the current embodiment is not limited to the shape illustrated in FIG. 2 and may be formed in various structures. For example, the common source line CSL 106 may not be formed completely on upper portions of the impurity regions 105 in the y-direction and may be formed only on a part of the upper portions of the impurity regions 105. In addition, the common source line CSL 106 may be formed by forming spacers (not shown) on sidewalls of a gate electrode 151 of the ground selection transistor GST and by forming a metallic layer (not shown) between the spacers to a predetermined height. Furthermore, the common source line CSL 106 may be formed by extending spacers to an uppermost second interlayer insulating layer 167 and by forming a metallic layer between the spacers.

The insulating region 170 may be formed on the common source line CSL 106. In other words, the insulating region 170 may be formed between adjacent memory cell strings 11 of FIG. 1 using different channel regions 130.

A plurality of gate electrodes 150 including gate electrodes 151 to 156 may be arranged from the substrate 100 to be separated from each other in the z-direction along lateral sides of the channel regions 130. The plurality of gate electrodes 150 may be gates of the ground selection transistor GST, the memory cells MC1, MC2, MC3, and MC4, and the string selection transistor SST. The gate electrodes 150 may be commonly connected to the adjacent memory cell strings 11 of FIG. 1 arranged in the y-direction. The gate electrode 156 of the string selection transistor SST may be connected to a string selection line SSL (see FIG. 1). The gate electrodes 152, 153, 154, and 155 of the memory cells MC1, MC2, MC3, and MC4 may be connected to the wordlines WL1, WL2, WLn-1, and WLn, respectively (see FIG. 1). The gate electrode 151 of the ground selection transistor GST may be connected to a ground selection line GSL (see FIG. 1). The gate electrodes 150 may be formed of a metallic layer, for example, W. In addition, although not shown, the gate electrodes 150 may further include a diffusion barrier layer (not shown). For example, the diffusion barrier layer may include at least one material selected from the group consisting of tungsten nitride (WN), tantalum nitride (TaN), and titanium nitride (TiN).

In an embodiment, the gate electrode 151 of the ground selection transistor GST may be formed by using polysilicon to form a sacrificial layer, by removing polysilicon using a halogen-containing reaction gas, and then by filling a metallic layer such as W.

A gate dielectric layer 140 may be disposed between the channel region 130 and the gate electrodes 150. Although not specifically shown in FIG. 2, the gate dielectric layer 140 may include a tunneling insulating layer, a charge storage layer, and a blocking insulating layer that are sequentially stacked on the channel region 130.

The tunneling insulating layer may tunnel charges to the charge storage layer by using an F-N method. The tunneling insulating layer may include silicon oxide, for example. The charge storage layer may be a charge trapping layer or a floating gate conductive layer. For example, the charge storage layer may include quantum dots or nanocrystals. Here, the quantum dots or the nanocrystals may include a conductor such as particles of metal or semiconductor. The blocking insulating layer may include a high-k dielectric material. Here, the high-k dielectric material refers to a dielectric material having a higher dielectric constant than that of an oxide layer.

For example, the gate dielectric layer 140 may be formed of one layer selected from the group consisting of an oxide-nitride-oxide (ONO) layer, an oxide-nitride-alumina (ONA) layer, and an oxide-nitride-oxide-alumina (ONOA) layer.

A plurality of interlayer insulating layers 160 including first interlayer insulating layer 161 and second interlayer insulating layers 162 to 167 may be arranged between the gate electrodes 150. The interlayer insulating layers 160 may be arranged separate from each other in the z-direction and to extend in the y-direction, similar to the gate electrodes 150. One side of each interlayer insulating layer 160 may contact a channel region 130. The interlayer insulating layers 160 may include silicon oxide or silicon nitride.

In FIG. 2, four memory cells, i.e., the memory cells MC1, MC2, MC3, and MC4, are arranged. However, this is just an example, and a larger or smaller number of memory cells than four memory cells may be arranged according to the capacity of the non-volatile memory device 1000. In addition, one string selection transistor SST and one ground selection transistor GST of the memory cell strings 11 of FIG. 1 are arranged. However, the inventive concept is not limited thereto. For example, there may be two or more string selection transistors SST or ground selection transistors GST. In addition, the string selection transistor SST and the ground selection transistor GST may have a different structure from that of the memory cells MC1, MC2, MC3, and MC4.

In the non-volatile memory device 1000 having a 3D vertical structure, in an embodiment of the inventive concept shown in FIG. 2, the gate electrode 151 of the ground selection transistor GST is formed by a metal replacement process using polysilicon so that the gate dielectric layer 140 may be prevented from protruding toward the substrate 100 and the resistance of the gate electrode 151 of the ground selection transistor GST can be markedly reduced.

Figure 3:
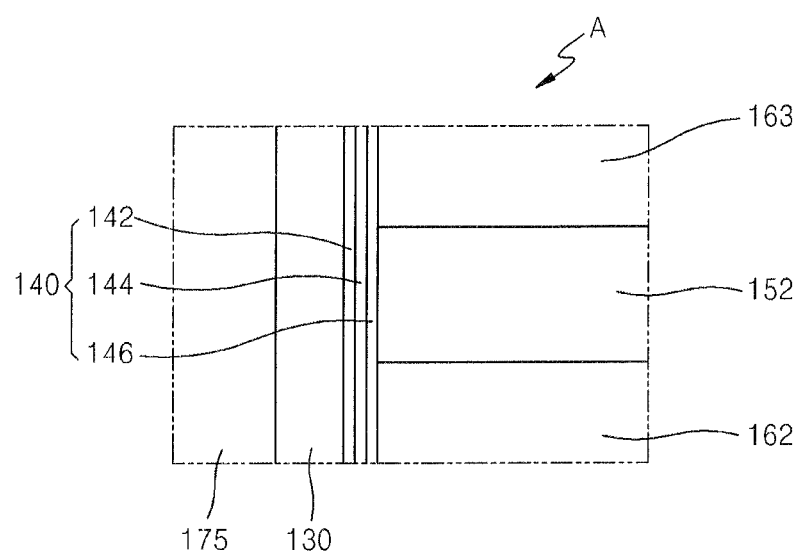
FIG. 3 is an enlarged cross-sectional view of portion A of FIG. 2.

FIG. 3 is an enlarged cross-sectional view of portion A of FIG. 2.

Referring to FIG. 3, the channel region 130 that may be used as a channel of the memory cell strings 11 of FIG. 1. The buried insulating layer 175 may be disposed on a left side of the channel region 130. The gate dielectric layer 140 may be disposed on a right side of the channel region 130.

The gate dielectric layer 140 may have a structure in which a tunneling insulating layer 142, a charge storage layer 144, and a blocking insulating layer 146 are sequentially stacked on the right side of the channel region 130.

The tunneling insulating layer 142 may be a single layer or a composite layer including at least one or more materials selected from the group consisting of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 144 may be a charge trapping layer or a floating gate conductive layer. When the charge storage layer 144 is a floating gate conductive layer, the charge storage layer 144 may be formed by depositing polysilicon on the substrate 100 by performing chemical vapor deposition (CVD), for example, low pressure CVD (LPCVD) using a $SiH_4$ or $Si_2H_6$ gas and a $PH_3$ gas. When the charge storage layer 144 is a charge trapping layer, the charge storage layer 144 may include at least one material selected from the group consisting of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum oxide ($Al_xN_y$), and aluminum gallium oxide ($AlGa_xN_y$).

The blocking insulating layer 146 may include at least one material selected from the group consisting of silicon oxide ($SiO_2$), silicon nitride ($Si_3N_4$), silicon oxynitride (SiON), and a high-k dielectric material. The blocking insulating layer 146 may be formed of material having a higher dielectric constant than that of the tunneling insulating layer 142, i.e., a high-k dielectric material. The high-k dielectric material layer may include at least one material selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 152 may be disposed on the right side of the gate insulating layer 140. The second interlayer insulating layers 162 and 163 may be disposed on upper and lower portions of the gate electrode 152.

Figure 4A:
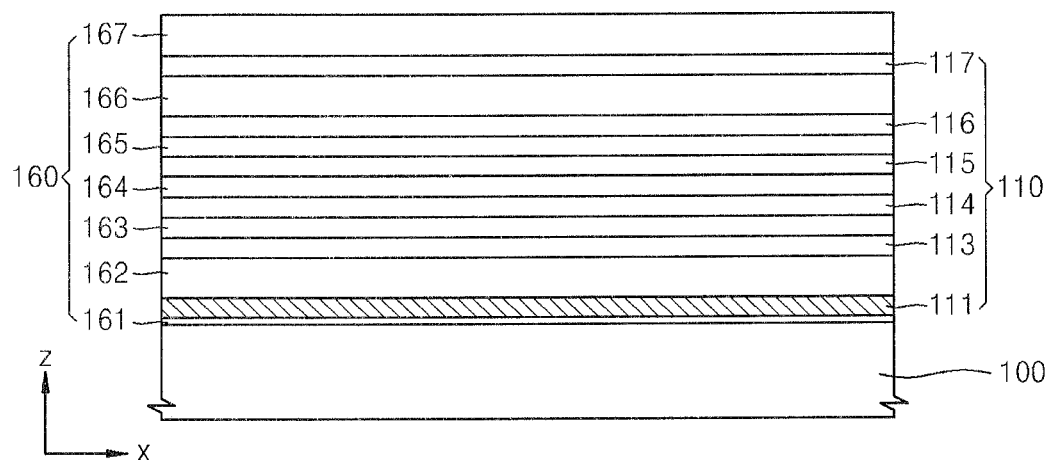
FIGS. 4A through 4N are cross-sectional views of a method of manufacturing a non-volatile memory device, according to an embodiment of the inventive concept.
Figure 4B:
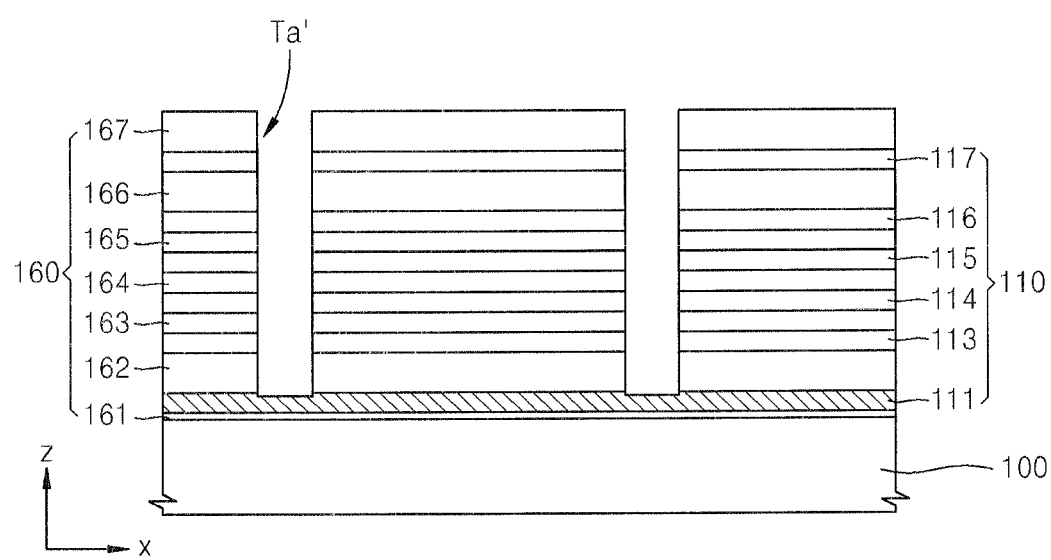
Figure 4C:
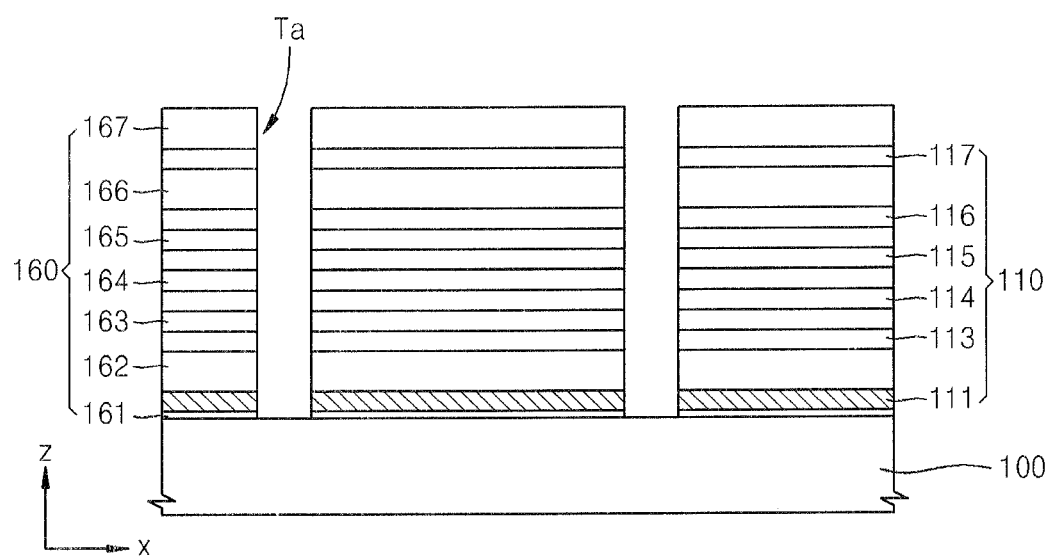
Figure 4D:
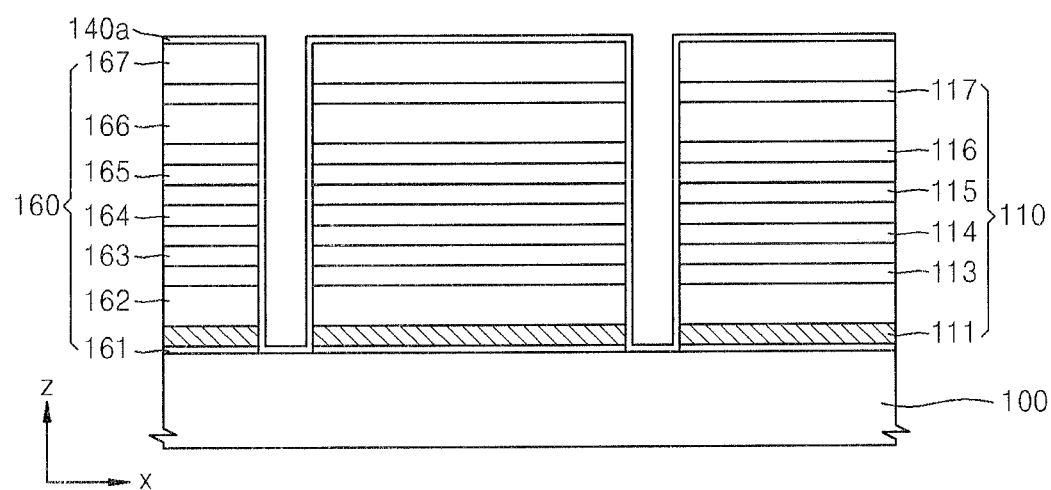
Figure 4E:
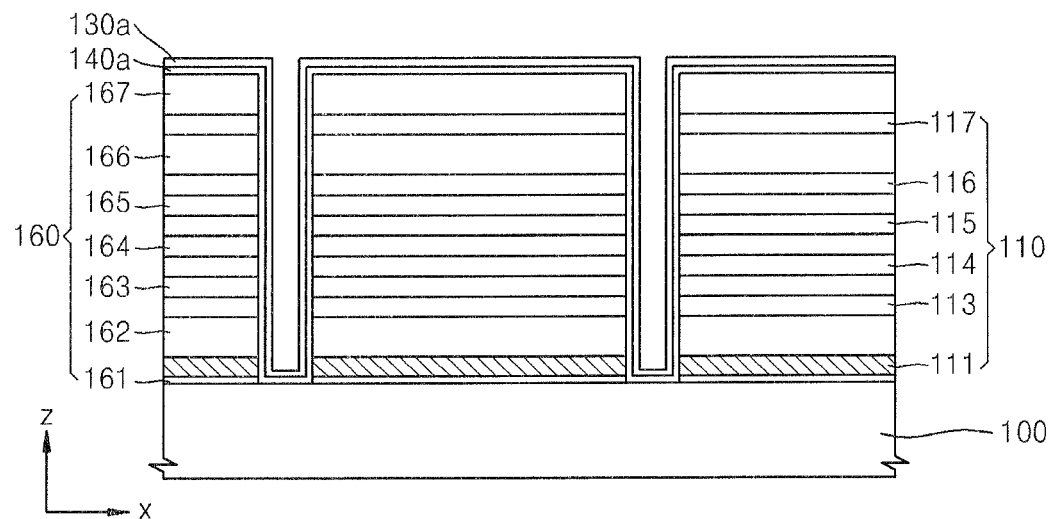
Figure 4F:
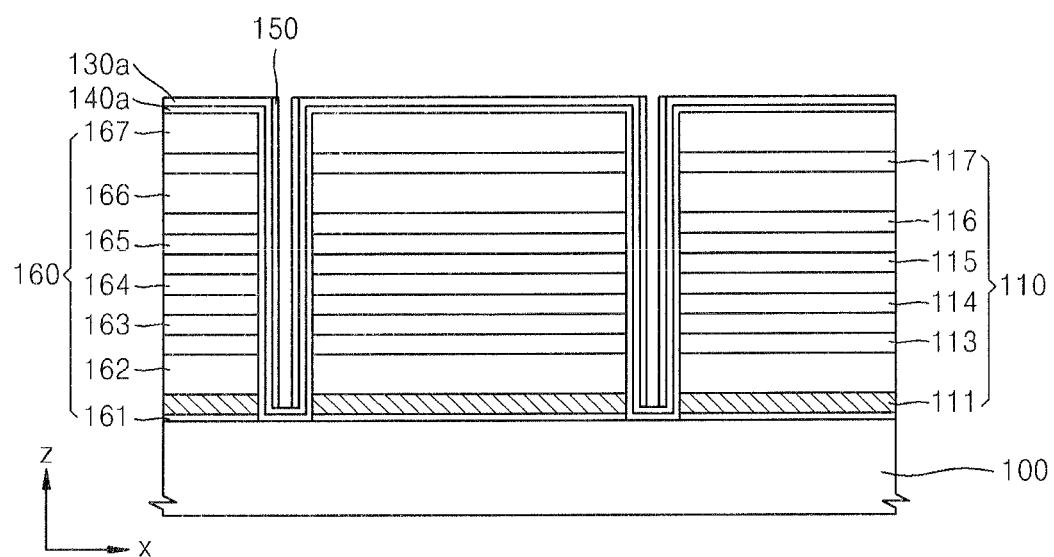
Figure 4G:
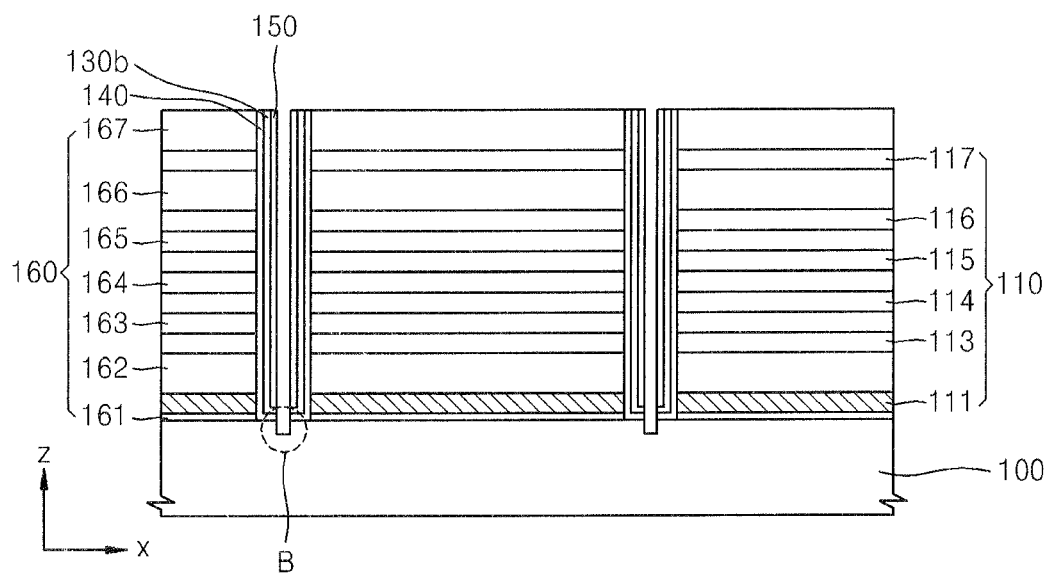
Figure 4H:
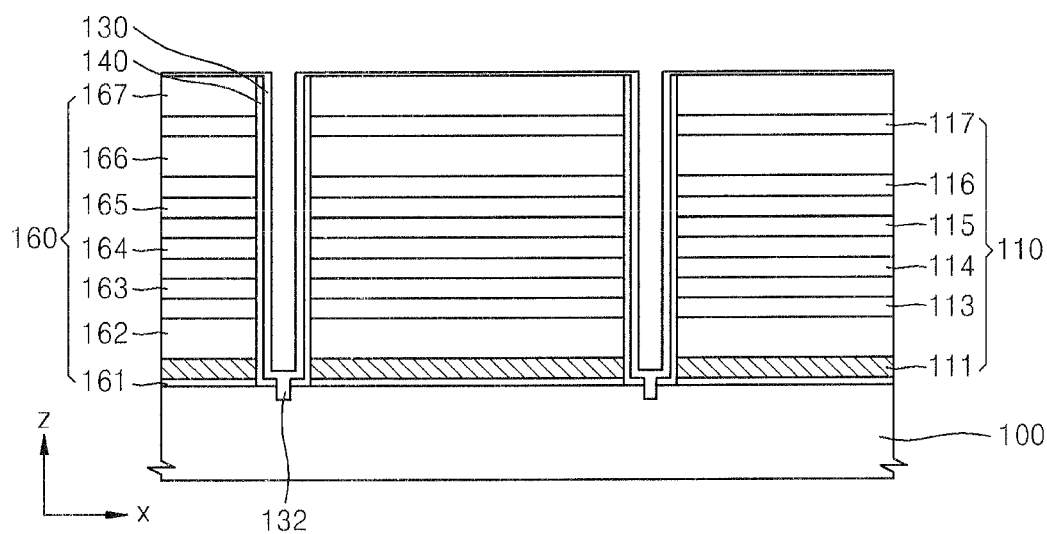
Figure 4I:
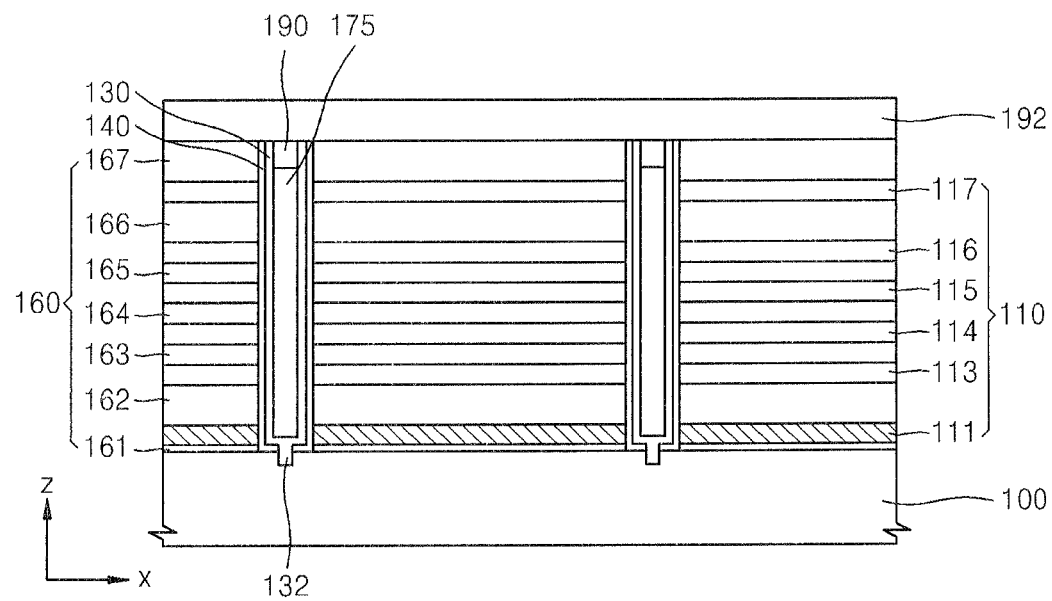
Figure 4J:
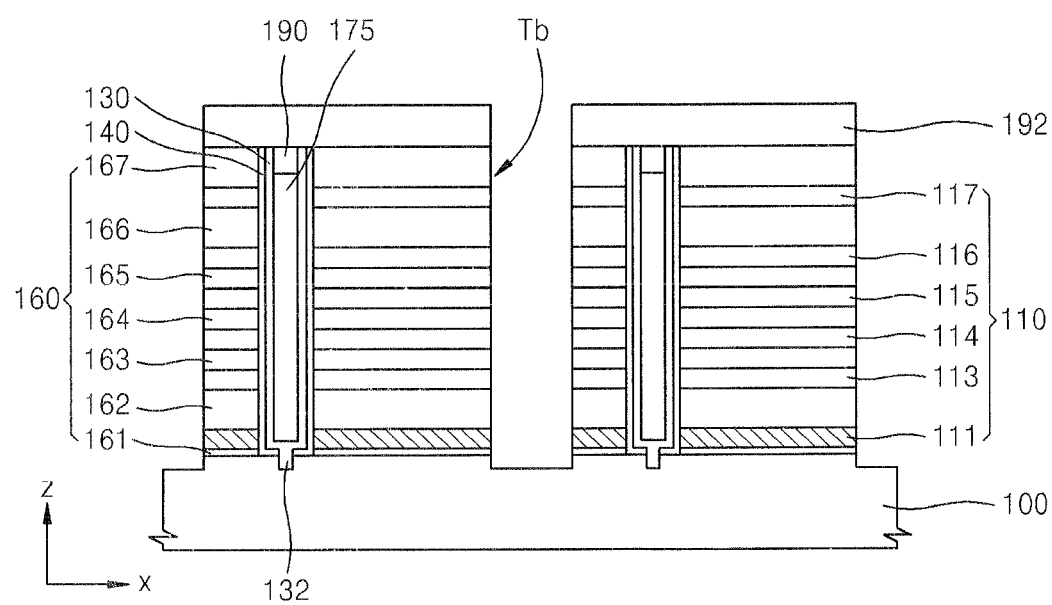
Figure 4K:
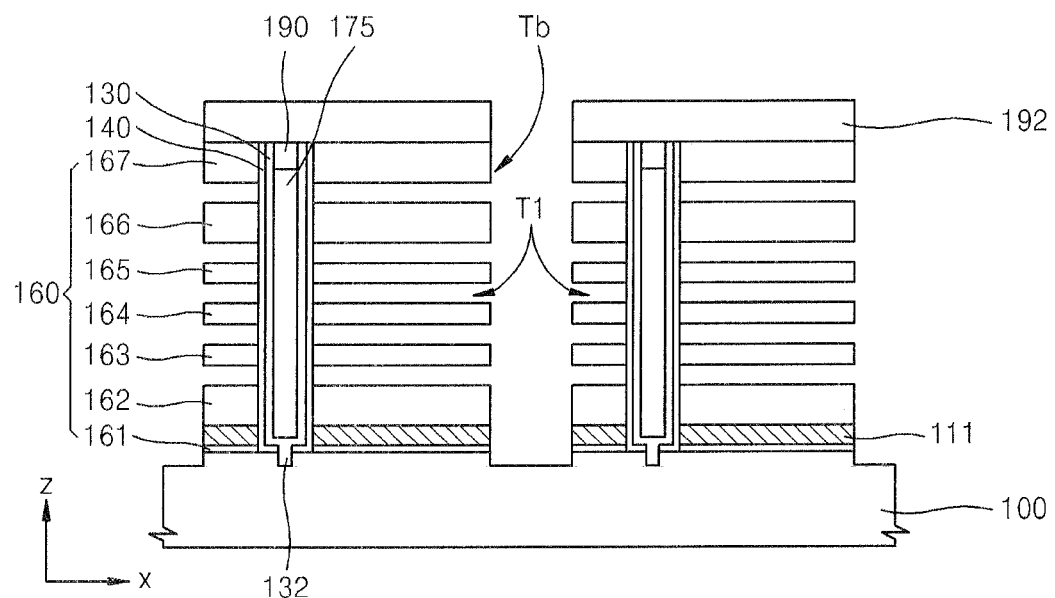
Figure 4L:
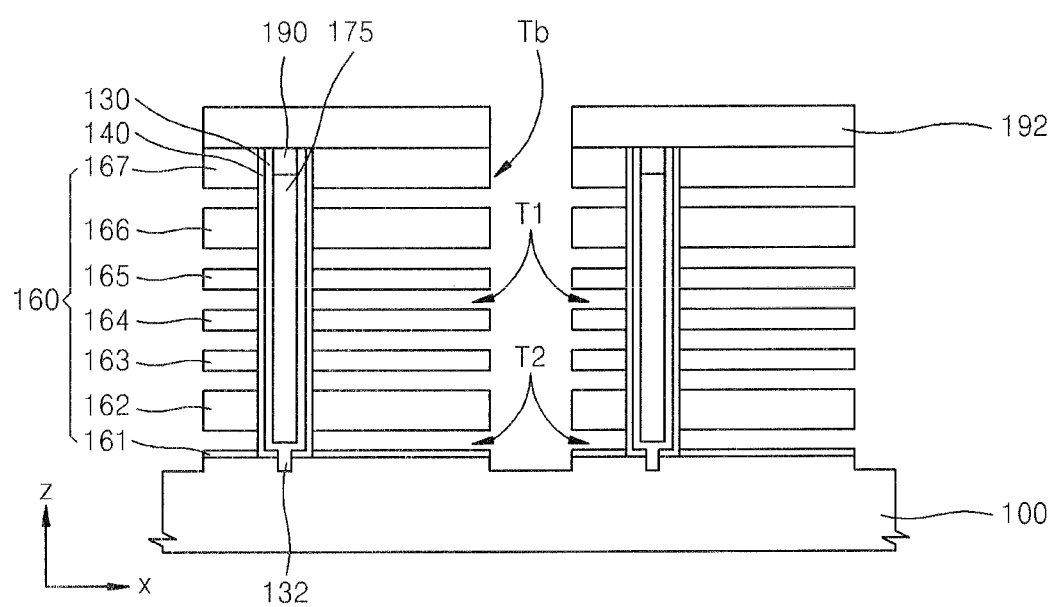
Figure 4M:
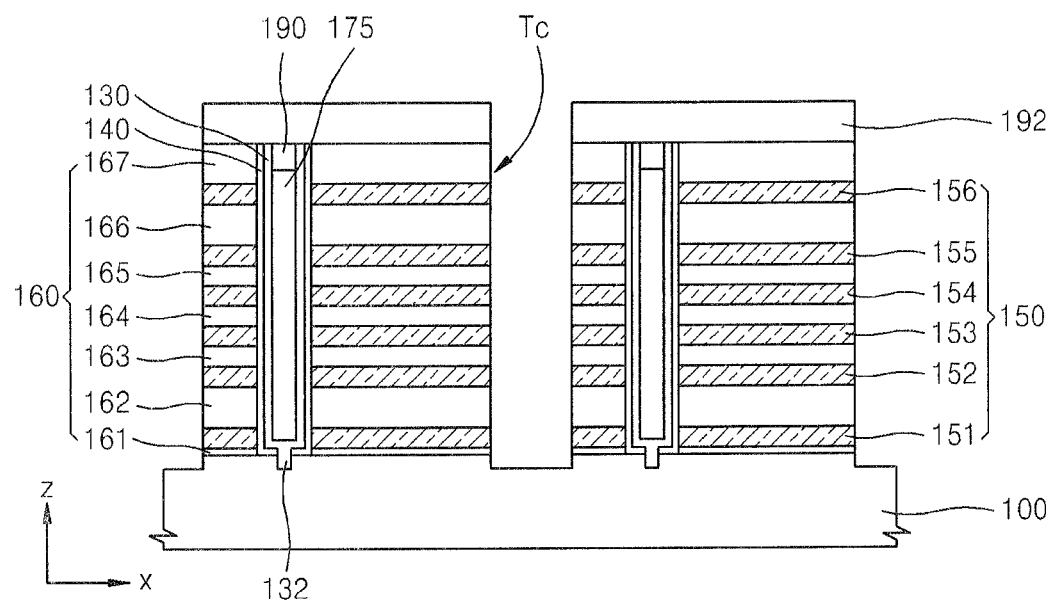
Figure 4N:
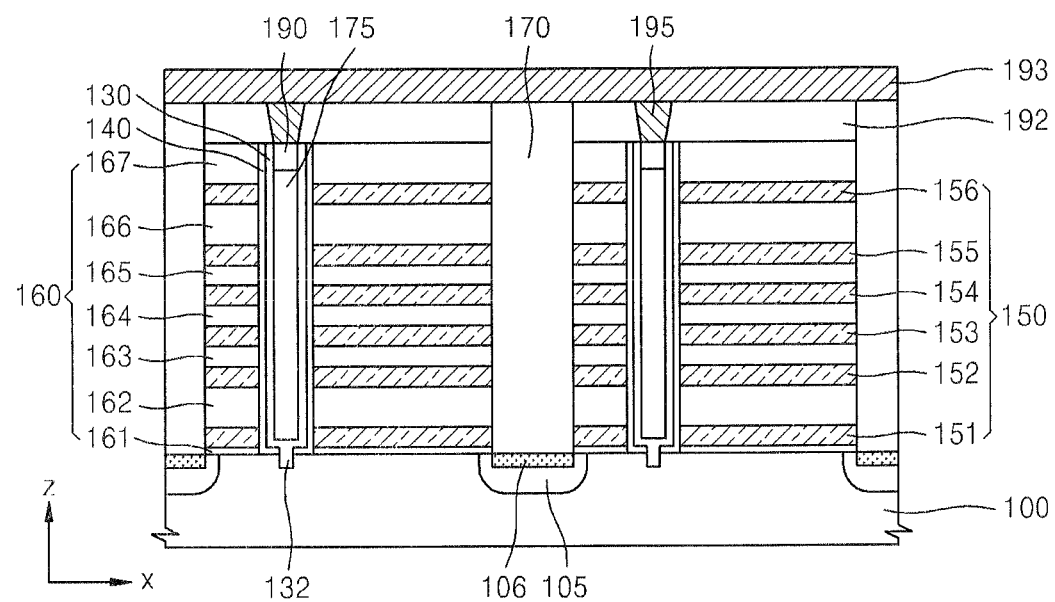

FIGS. 4A through 4N are cross-sectional views of a method of manufacturing a non-volatile memory device, according to an embodiment of the inventive concept, wherein the perspective view of FIG. 2 is seen in the y-direction according to a process sequence.

Referring to FIG. 4A, a plurality of interlayer insulating layers 160, including first and second interlayer insulating layers 161 to 167, and a plurality of sacrificial layers 110, including first sacrificial layer 111 and second sacrificial layers 113 to 117, are alternately stacked on the substrate 100. The interlayer insulating layers 160 and the sacrificial layers 110 may be alternately stacked on the substrate 100 starting from the first interlayer insulating layer 161, as illustrated in FIG. 4A.

The second sacrificial layers 113 to 117 except for the first sacrificial layer 111 that is a lowermost layer from among the sacrificial layers 110 may be formed of material having a different etch selectivity with respect to the interlayer insulating layers 160. For example, the second sacrificial layers 113 to 117 may be formed of material by which the second sacrificial layers 113 to 117 may be etched with a higher etch rate than that of the interlayer insulating layers 160 with respect to a predetermined etchant. In other words, the second sacrificial layers 113 to 117 may be formed of material by which the second sacrificial layers 113 to 117 may be etched while minimizing etching of the interlayer insulating layers 160 with respect to the predetermined etchant. This etch selectivity may be expressed in a quantitative manner by using a ratio of an etch rate of the second sacrificial layers 113 to 117 to the etch rate of the interlayer insulating layers 160. The interlayer insulating layers 160 may be formed of at least one material selected from the group consisting of silicon oxide and silicon nitride, and the second sacrificial layers 113 to 117 may be formed of one material selected from the group consisting of a silicon layer, a silicon oxide layer, a silicon carbide layer, and a silicon nitride layer, which are formed of another material having a different etch selectivity with respect to the interlayer insulating layers 160.

The first sacrificial layer 111 that is indicated by hatching may be formed of material having a different etch selectivity with respect to the interlayer insulating layers 160 and having a different etch selectivity with respect to the second sacrificial layers 113 to 117 that are upper layers to the first sacrificial layer 111. In other words, the first sacrificial layer 111 may be formed of material having a lower etch rate than that of the second sacrificial layers 113 to 117 with respect to a first etchant and having a higher etch rate than that of the interlayer insulating layers 160 with respect to a second etchant. When the second sacrificial layers 113 to 117 are etched using the first etchant, etching of the first sacrificial layer 111 and the interlayer insulating layers 160 may be minimized, and when the first sacrificial layer 111 is etched using the second etchant, etching of the interlayer insulating layers 160 may be minimized.

Furthermore, the first sacrificial layer 111 may be formed of material having a different etch selectivity with respect to the substrate 100. Thus, when the first sacrificial layer 111 is etched using the second etchant, etching of the substrate 100, for example, a silicon substrate, may be minimized.

Here, the second etchant may include a halogen-containing reaction gas. For example, the second etchant may include at least one reaction gas selected from the group consisting of $Cl_2$, $NF_3$, $ClF_3$, and $F_2$. Obviously, the second etchant may also include a carrier gas such as $N_2$. In the current embodiment, the first sacrificial layer 111 may be formed of polysilicon, and a $Cl_2$ gas may be used as the second etchant. In addition, polysilicon may be N-type polysilicon.

According to an embodiment, the thicknesses of the interlayer insulating layers 160 may not be the same, as illustrated in FIG. 4A. The first interlayer insulating layer 161 that is the lowermost layer from among the interlayer insulating layers 160 may be formed to a very small thickness. The first interlayer insulating layer 161 may be formed of the same material as that of the second interlayer insulating layers 162 to 167 that are upper layers to the first interlayer insulating layer 161 but may be formed of a different material from that of the second interlayer insulating layers 162 to 167. Even when the first interlayer insulating layer 161 is formed of another material, a different etch selectivity with respect to the sacrificial layers 110 may be the same as described above. The first interlayer insulating layer 161 may be a kind of buffer layer, may be formed of a middle temperature oxide (MTO) layer, and may insulate the gate electrode 151 of FIG. 2 of the ground selection transistor GST from the substrate 100.

The thicknesses of the interlayer insulating layers 160 and the sacrificial layers 110 may be modified in various ways, and the number of layers that constitute the interlayer insulating layers 160 and the sacrificial layers 110 may also be modified.

Referring to FIG. 4B, in an embodiment, first intermediate openings Ta' are formed to expose a portion of the first sacrificial layer 111 through the second interlayer insulating layers 162 to 167 and the second sacrificial layers 113 to 117 that are alternately stacked on the substrate 100.

The first intermediate openings Ta' may be formed by forming a predetermined mask pattern that defines the position of the first intermediate openings Ta' on the alternately-stacked interlayer insulating layers 160 and the sacrificial layers 110 and by anisotropically etching the second interlayer insulating layers 162 to 167 and the second sacrificial layers 113 to 117 by using an etchant in which the second interlayer insulating layers 162 to 167 and the second sacrificial layers 113 to 117 may be etched together by using the mask pattern as an etch mask.

In the anisotropic etch process, the first sacrificial layer 111 acts as a first etch stopper. Thus, the portion of a top surface of the first sacrificial layer 111 may be exposed, as illustrated in FIG. 4B.

Referring to FIG. 4C, in an embodiment, subsequently, a first opening Ta that exposes a portion of the substrate 100 is formed by anisotropically etching the first sacrificial layer 111 exposed through the first intermediate openings Ta' and the first interlayer insulating layer 161 formed under the first sacrificial layer 111. Here, the first opening Ta includes the first intermediate openings Ta'. Although not shown, when the first opening Ta is formed, the first interlayer insulating layer 161 acts as a second etch stopper. For example, the first sacrificial layer 111 is first etched using an etchant that is different from an etchant used in etching of the upper layers, namely, the second sacrificial layers 113 to 117 and second interlayer insulating layers 162 to 167, and then, the first interlayer insulating layer 161 may be etched using another etchant. Finally, due to the existence of the first sacrificial layer 111 and the first interlayer insulating layer 161, an anisotropic etch process may be precisely adjusted. Thus, the first openings Ta may be formed without forming a recess in the substrate 100. For example, a recess may not be formed in the substrate 100, and a portion of the substrate 100 exposed through the first openings Ta may be a top surface of the substrate 100.

The first openings Ta may be holes having a predetermined depth in the z-direction. Obviously, the structure of the first openings Ta may not be limited to round holes. In other words, the first openings Ta may be formed in various shapes according to the structure of a channel region to be formed. In addition, the first openings Ta may be isolation regions that are formed to be separated from each other in the x- and y-directions (see FIG. 3).

Referring to FIG. 4D, in an embodiment, a gate dielectric layer 140a is formed to uniformly cover inner walls and a lower surface of the first openings Ta. The gate dielectric layer 140a may include a blocking insulating layer, a charge storage layer, and a tunneling insulating layer, as illustrated in FIG. 3. Thus, the blocking insulating layer, the charge storage layer, and the tunneling insulating layer may be sequentially stacked in the first openings Ta. The blocking insulating layer, the charge storage layer, and the tunneling insulating layer may be formed using atomic layer deposition (ALD), chemical vapor deposition (CVD), or physical vapor deposition (PVD).

As described above, because a recess is not formed in the substrate 100 when the first openings Ta are formed, a bottom surface of the gate dielectric layer 140a may form the same plane as the top surface of the substrate 100.

Referring to FIG. 4E, in an embodiment, a first channel layer 130a is formed on the gate dielectric layer 140a. The first channel layer 130a may be formed of a semiconductor material such as polysilicon or single crystalline silicon. The semiconductor material may include an undoped impurity or a p-type or n-type impurity. The first channel layer 130a may be formed by using ALD or CVD.

Referring to FIG. 4F, in an embodiment, a spacer 150 is formed at sidewalls of the first channel layer 130a. The spacer 150 may be formed of silicon oxide or silicon nitride by using ALD or CVD. The spacer 150 is used as a mask for etching bottom surfaces of the first channel layer 130a and the gate dielectric layer 140 and may prevent the first channel layer 130a from being damaged in the etch process.

Referring to FIG. 4G, in an embodiment, the bottom surfaces of the first channel layer 130a and the gate dielectric layer 140a are anisotropically etched by using the spacer 150 as a mask, forming a contact hole B for exposing the substrate 100. As illustrated in FIG. 4G, due to over etching caused by anisotropic etching, the substrate 100 may be recessed to a predetermined depth. In this way, the substrate 100 is recessed so that a contact area between the substrate 100 and the first channel layer (see FIG. 4H) filled in the recess portion of the substrate 100 may increase and a resistance thereof may be reduced.

Referring to FIG. 4H, in an embodiment, the spacer 150 is removed, and a channel material for covering sides and a bottom surface of the first openings Ta is deposited on the first channel layer 130b and the substrate 100, forming a channel region 130 including the first channel layer 130b. By depositing the channel material, the channel material may be filled in a contact hole B. Thus, the channel region 130 may include a contact portion 132 and may be electrically connected to the substrate 100 via the contact portion 132. The channel material may be the same material as the first channel layer 130b and may include a semiconductor material such as polysilicon or single crystalline silicon.

The spacer 150 may be removed by a wet cleaning process, for example. The wet cleaning process may be performed using a mixed solution of ammonia and hydrogen peroxide and fluorine. The spacer 150 may be removed using an additional process or by performing a cleaning process performed before the channel region 130 is formed.

Referring to FIG. 4I, in an embodiment, the first openings Ta are buried with the buried insulating layer 175. Optionally, before the buried insulating layer 175 is formed, a hydrogen annealing operation in which a structure including the channel region 130 is thermally heated in a gas atmosphere including hydrogen or deuterium may be further performed. By performing the hydrogen annealing operation, many portions of crystal defects that exist in the channel region 130 may be removed.

Then, to remove unnecessary semiconductor material and insulating material that cover the uppermost second interlayer insulating layer 167, a planarization process, for example, a chemical mechanical polishing (CMP) process or an etch-back process may be performed until the uppermost second interlayer insulating layer 167 is exposed. After that, an upper portion of the buried insulating layer 175 is removed using an etch process, and a conductive material is filled in the space where the upper portion of the buried insulating layer 175 was removed, and the planarization process is performed, forming the conductive layer 190. After the conductive layer 190 is formed, a wiring insulating layer 192 is formed on the entire surface of a resultant structure of the substrate 100. The wiring insulating layer 192 may also be formed after the insulating region 170 (see FIG. 4N) is formed.

Referring to FIG. 4J, in an embodiment, the interlayer insulating layers 160 and the sacrificial layers 110 between the first openings Ta are anisotropically etched, forming second openings Tb for exposing the substrate 100. Although not shown, even when the second openings Tb are formed, the first sacrificial layer 111 and the first interlayer insulating layer 161 may act as a first etch stopper and a second etch stopper, respectively. The second openings Tb may extend in the y-direction (see FIG. 2). One second opening Tb may be formed between the channel regions 130. However, the spirit of the inventive concept is not limited thereto, and the relative arrangement of the channel region 130 and the second openings Tb may be changed.

As illustrated in FIG. 4J, the substrate 100 may be recessed to a predetermined depth due to over anisotropic etching. Lateral sides of the interlayer insulating layers 160 and the sacrificial layers 110 may be exposed by forming the second openings Tb.

Referring to FIG. 4K, in an embodiment, the second sacrificial layers 113 to 117 exposed through the second openings Tb are removed by performing a first etch process, forming a plurality of first lateral openings T1 defined between the interlayer insulating layers 160. Portions of lateral sides of the gate dielectric layer 140 may be exposed through the first lateral openings T1.

The first lateral openings T1 may be formed by etching the second sacrificial layers 113 to 117 in a horizontal direction by using an etchant having an etch selectivity with respect to the interlayer insulating layers 160 and the first sacrificial layer 111. For example, when the second sacrificial layers 113 to 117 are silicon nitride layers, the first sacrificial layer 111 is a polysilicon layer and the interlayer insulating layers 160 are silicon oxide layers, the first etch process may be performed using an etchant including phosphor (P). The first etch process may be an isotropic etch process including wet etching or chemical dry etching (CDE).

Referring to FIG. 4L, in an embodiment, the first sacrificial layer 111 exposed through the second openings Tb is removed by performing a second etch process, forming lowermost second lateral openings T2. The second lateral openings T2 may be formed by etching the first sacrificial layer 111 in a horizontal direction by using an etchant having an etch selectivity with respect to the interlayer insulating layers 160. As described above, the first sacrificial layer 111 has also an etch selectivity with respect to the substrate 100 so that etching of the substrate 100 in the second etch process may be minimized.

For example, when the first sacrificial layer 111 is a polysilicon layer, the substrate 100 is a silicon substrate in a <100>-crystalline direction and the interlayer insulating layers 160 are silicon oxide layers, the second etch process may be performed using gas phase etching or CDE using an etchant including a halogen-containing reaction gas. The second etch process may be an isotropic etch process.

In addition, the second etch process may be performed using a plasma-less thermal etch process. The thermal etch process of the second etch process may be performed at a temperature lower than 500° C. By performing the thermal etch process on such a temperature condition, an etch selectivity of the first sacrificial layer 111 with respect to the substrate 100 and the interlayer insulating layers 160 may be maximized.

The halogen-containing reaction gas may include one or more gases selected from the group consisting of $Cl_2$, $NF_3$, $ClF_3$, and $F_2$. In association with the thermal etch process, the halogen-containing reaction gas such as $Cl_2$, $NF_3$, $ClF_3$ may be used at a temperature lower than 500° C., and the halogen-containing reaction gas $F_2$ may be used at a temperature lower than 200° C.

Figure 5A:
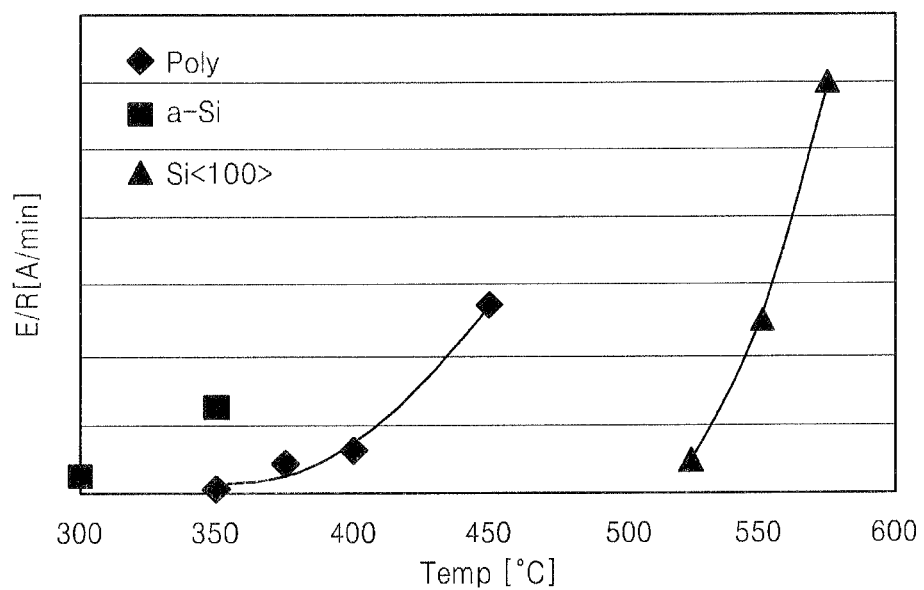
FIGS. 5A and 5B are graphs showing an etch rate of a $Cl_2$-containing reaction gas versus temperature with respect to each material layer.
Figure 5B:
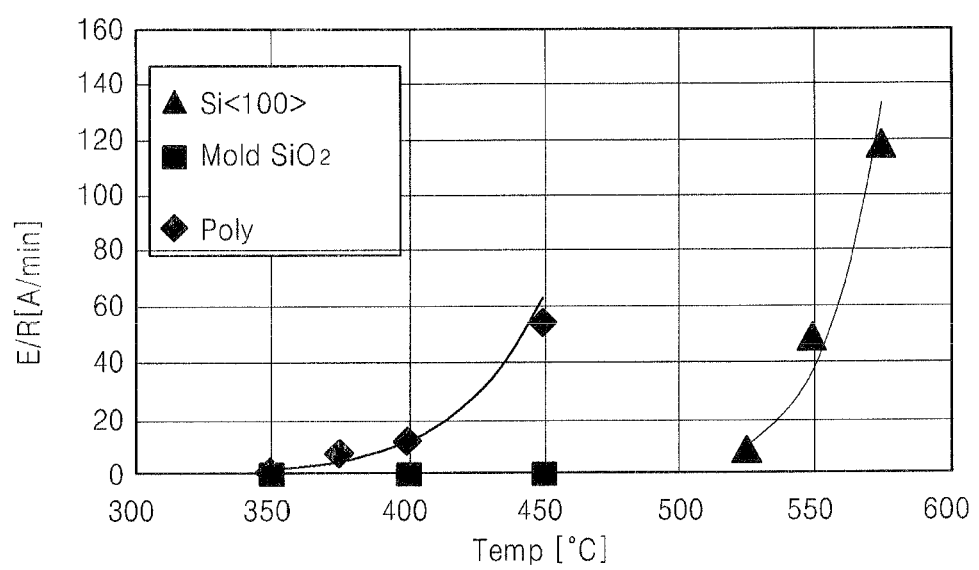

A more detailed description of an embodiment of the thermal etch process will be provided with reference to FIGS. 5A and 5B.

Referring to FIG. 4M, in an embodiment, a conductive material is filled in the second openings Tb and the first and second lateral openings T1 and T2. The conductive material may be metal, for example, tungsten (W). After the filling operation is performed, portions corresponding to the second openings Tb are isotropically etched, forming third openings Tc. By forming the third openings Tc, the conductive material is filled only in the first and second lateral openings T1 and T2 so that gate electrodes 150 including gate electrodes 151 to 156 corresponding to a ground selection transistor GST, memory cells MC1, MC2, MC3, and MC4, and string selection transistor (SST) may be formed.

In an embodiment, the gate electrodes 150 are formed as a metallic layer such as W so that the resistance of the gate electrodes 150 may be significantly reduced compared to a case where the gate electrodes 150 are formed of polysilicon. In an embodiment, the gate electrode 151 of the ground selection transistor GST is formed as a metallic layer so that operating characteristics of the ground selection transistor GST may be improved.

The processes illustrated in FIGS. 4K through 4M are processes of replacing the sacrificial layers 110 as a metallic layer. Thus, the processes illustrated in FIGS. 4K through 4M are referred to as a metal replacement process.

Referring to FIG. 4N, in an embodiment, an impurity is injected into the substrate 100 through the third openings Tc, forming an impurity region 105. The impurity region 105 may be a source region. Next, a common source line CSL 106 is formed on the impurity region 105. The common source line CSL 106 may be formed of metal silicide, for example, $CoSi_x$. In addition, the common source line CSL 106 may include metal silicide and a metallic layer formed on metal silicide. Here, the metallic layer may be formed of W, Al, Cu, or the like.

Then, in an embodiment, the insulating region 170, in which the third openings Tc on the common source line CSL 106 are filled, is formed. The insulating region 170 may be formed of the same material as material for the interlayer insulating layers 160. The insulating region 170 may be formed by depositing an insulating material and by performing a planarization process.

Then, bitline contact plugs 195 that contact the conductive layer 190 are formed through the wiring insulating layer 192 by using a photolithography process and an etch process. Subsequently, bitlines 193 for connecting the bitline contact plugs 195 arranged in the x-direction are formed on the wiring insulating layer 192 and the insulating region 170.

When the wiring insulating layer 192 is not formed after the conductive layer 190 has been formed in FIG. 4I, the wiring insulating layer 192 may be formed after the insulating region 170 has been formed, and then, the bitline contact plugs 195 and the bitlines 193 may be formed.

FIGS. 5A and 5B are graphs showing an etch rate of a $Cl_2$-containing reaction gas versus temperature with respect to each material layer.

Referring to FIG. 5A, first, polysilicon (♦) is etched at a lower temperature than 500° C. with respect to the $Cl_2$-containing reaction gas, whereas silicon (▲) in a <100>-crystalline direction is etched at a higher temperature than 500° C. Thus, when a gas phase etching process is performed at a lower temperature than 500° C. by using the $Cl_2$-containing reaction gas in the second etch process of FIG. 4L, a polysilicon layer that is a first sacrificial layer may be etched and removed without etching the substrate.

In the graph, amorphous silicon (■) is etched at a lower temperature than 500° C. and thus may be used as a first sacrificial layer, instead of polysilicon.

Referring to FIG. 5B, polysilicon (♦) is etched at a temperature lower than 500° C. with respect to the $Cl_2$-containing reaction gas, whereas silicon (▲) in a <100>-crystalline direction is etched only at a temperature higher than 500° C., as illustrated in FIG. 5A. Mold silicon oxide ($SiO_2$)(■) is not etched regardless of the temperature. In other words, $SiO_2$ and $Cl_2$ do not chemically react with each other thermodynamically at a temperature lower than 1000° C., as in the reaction $SiO_2(s)+Cl_2(g) \rightarrow SiO_2(s)+Cl_2(g)$.

Referring to FIGS. 5A and 5B, the silicon substrate 100 in the <100>-crystalline direction and the interlayer insulating layers 160 formed of $SiO_2$ are exposed after the first etch process has been performed. However, as described above, the silicon substrate 100 in the <100>-crystalline direction and the interlayer insulating layers 160 formed of $SiO_2$ are not etched by the $Cl_2$-containing reaction gas at a lower temperature than 500° C. Thus, by performing the gas phase etching process using the $Cl_2$-containing reaction gas, the silicon substrate 100 in the <100>-crystalline direction and the interlayer insulating layers 160 formed of $SiO_2$ are not damaged, and only the first sacrificial layer 111 formed of polysilicon may be optionally and efficiently removed.

Figure 6A:
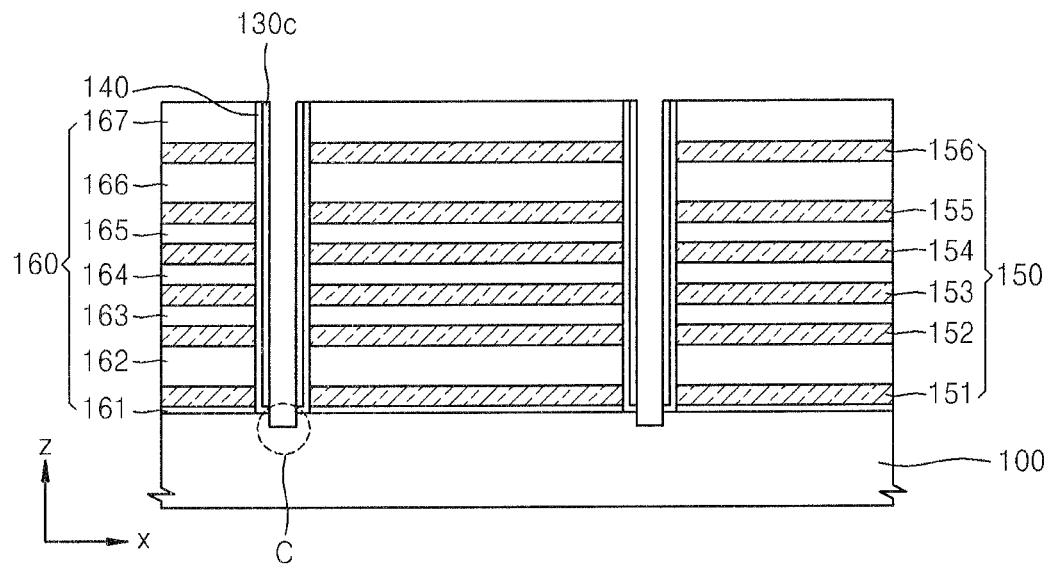
FIGS. 6A and 6B are cross-sectional views of a method of manufacturing a non-volatile memory device, according to an embodiment of the inventive concept.
Figure 6B:
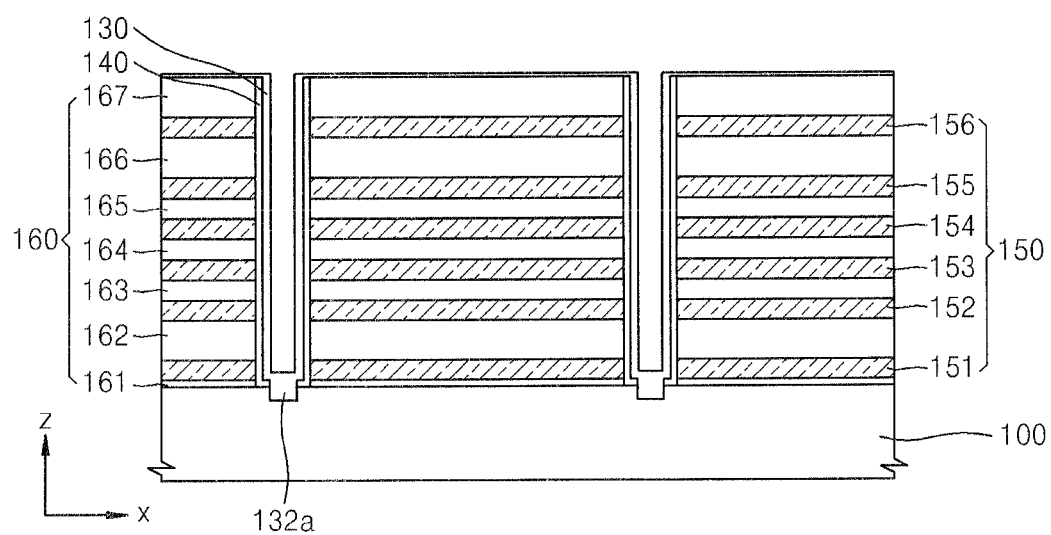

FIGS. 6A and 6B are cross-sectional views of a method of manufacturing a non-volatile memory device, according to an embodiment of the inventive concept, which illustrate a modified example of the processes of FIGS. 4F through 4H. Thus, a description of the processes before and after FIGS. 4F through 4H will not be provided here.

Referring to FIG. 6A, after a first channel layer 130c is formed, a gate dielectric layer 140 and a first channel layer 130c disposed on bottom surfaces of the first openings Ta are etched, forming a contact hole C for exposing the substrate 100. The etch process may include a process of anisotropically etching a bottom surface of the first channel layer 130c and etching a bottom surface of the gate dielectric layer 140 by using the first channel layer 130c as an etch mask. Due to over anisotropic etching, the substrate 100 may be recessed to a predetermined depth. In this way, the substrate 100 is recessed so that a contact area between the substrate 100 and a channel layer that will be filled in the recess portion of the substrate 100 may increase and a resistance thereof may be reduced.

Optionally, the anisotropic etching process may be performed before the first channel layer 130c is formed after the gate dielectric layer 140 has been formed. In this case, the first channel layer 130c directly contacts the substrate 100 and thus, the process of FIG. 6B may be omitted.

Referring to FIG. 6B, a channel material for uniformly covering sides and bottom surfaces of the first openings Ta is deposited on the substrate 100 and the first channel layer 130c, forming a channel region 130 including the first channel layer 130c. By depositing the channel material, the channel material may be filled in the contact hole C. Thus, the channel region 130 may include a contact portion 132a and may be electrically connected to the substrate 100 via the contact portion 132a. In an embodiment, because the contact hole C is formed using the first channel layer 130c without using an additional spacer, a width of the contact portion 132a may be larger than the contact portion 132 of FIG. 4I. Thus, a contact area between the channel region 130 and the substrate 100 increases, and a resistance thereof may be further reduced.

Figure 7:
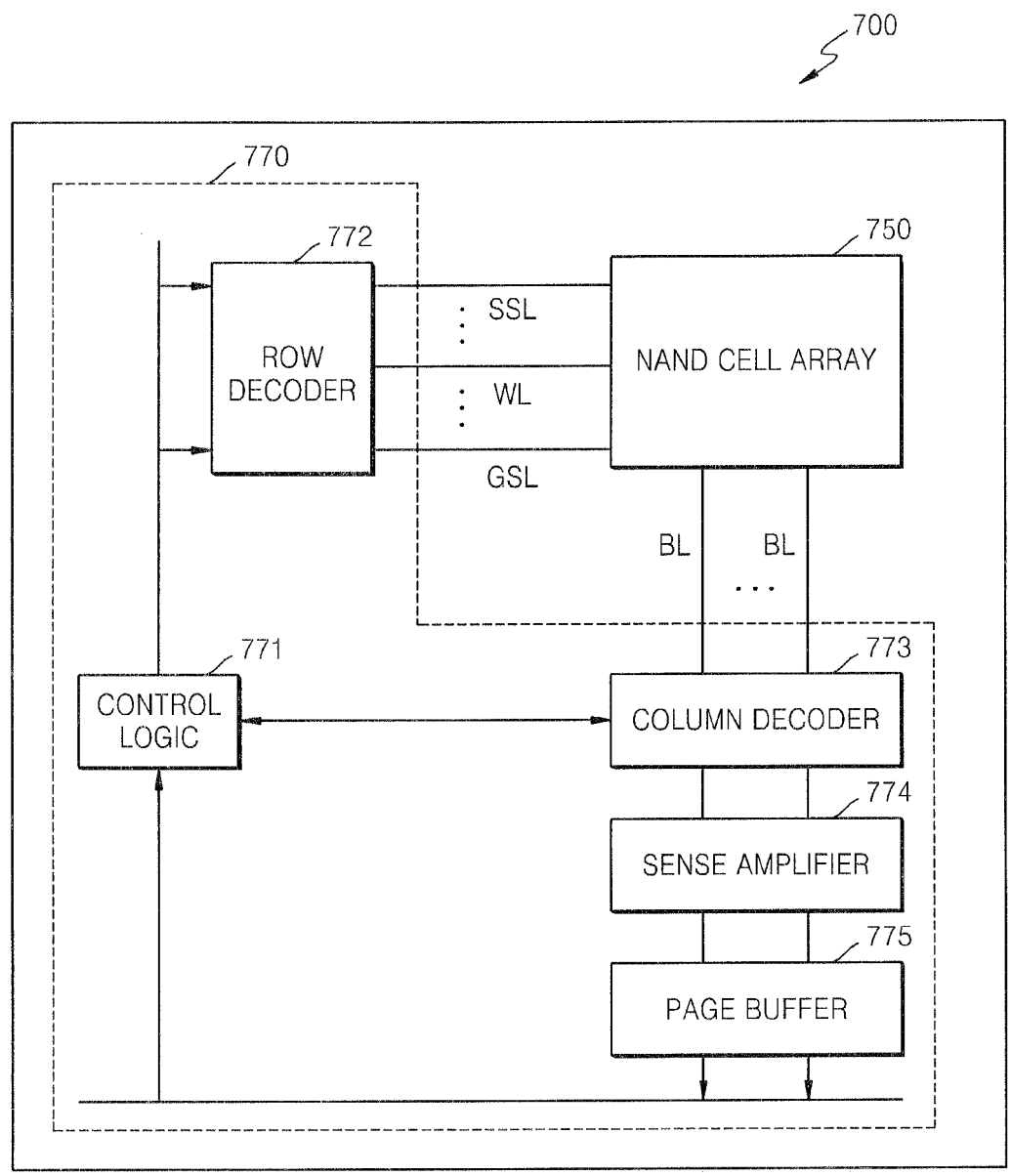
FIG. 7 is a schematic block diagram of a non-volatile memory device according to an embodiment of the inventive concept.

FIG. 7 is a schematic block diagram of a non-volatile memory device 700, according to an embodiment of the inventive concept.

Referring to FIG. 7, in the non-volatile memory device 700, a NAND cell array 750 may be connected to a core circuit unit 770. For example, the NAND cell array 750 may include the vertical structure non-volatile memory device 1000 of FIG. 2. The core circuit unit 770 may include a control logic 771, a row decoder 772, a column decoder 773, a sense amplifier 774, and a page buffer 775.

The control logic 771 may communicate with the row decoder 772, the column decoder 773, and the page buffer 775. The row decoder 772 may communicate with the NAND cell array 750 via a plurality of string selection lines SSL, a plurality of wordlines WL, and a plurality of ground selection lines GSL. The column decoder 773 may communicate with the NAND cell array 750 via a plurality of bitlines BL. When a signal is output from the NAND cell array 750, the sense amplifier 774 may be connected to the column decoder 773, and when a signal is transmitted to the NAND cell array 750, the sense amplifier 774 may not be connected to the column decoder 773.

For example, the control logic 771 may transmit a row address signal to the row decoder 772, and the row decoder 772 may decode the row address signal and may transmit the decoded row address signal to the NAND cell array 750 via the plurality of string selection lines SSL, the plurality of wordlines WL, and the plurality of ground selection lines GSL. The control logic 771 may transmit a column address signal to the column decoder 773 or the page buffer 775, and the column decoder 773 may decode the column address signal and may transmit the decoded column address signal to the NAND cell array 750 via the plurality of bitlines BL. The signals from the NAND cell array 750 may be transmitted to the sense amplifier 774 via the column decoder 773, may be amplified by the sense amplifier 774, and may be transmitted to the control logic 771 via the page buffer 775.

Figure 8:
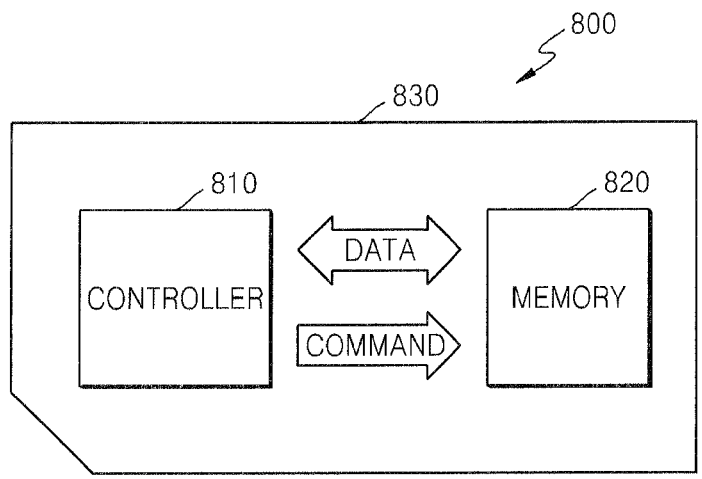
FIG. 8 is a schematic block diagram of a memory card according to an embodiment of the inventive concept.

FIG. 8 is a schematic block diagram of a memory card 800 according to an embodiment of the inventive concept.

Referring to FIG. 8, the memory card 800 may include a controller 810 embedded in a housing 830, and a memory 820. The controller 810 and the memory 820 are disposed to send/receive electric signals to/from each other. For example, when the controller 810 sends a command to the memory 820, the memory 820 can send/receive data. Thus, the memory 800 may store data in the memory 820 or may output data from the memory 820 to an external device.

For example, the memory 820 may include the vertical structure non-volatile memory device 1000 of FIG. 2. The memory card 800 may be used as a data storage medium for various portable devices. For example, the memory card 800 may include a multimedia card (MMC) or secure digital card (SD).

Figure 9:
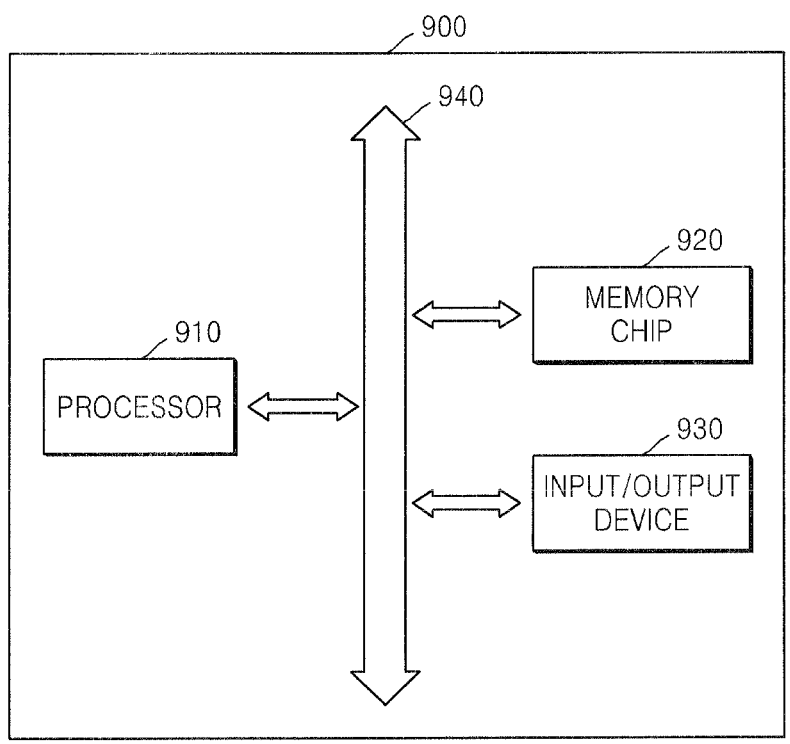
FIG. 9 is a schematic block diagram of an electronic system according to an embodiment of the inventive concept.

FIG. 9 is a schematic block diagram of an electronic system 900 according to an embodiment of the inventive concept.

Referring to FIG. 9, the electronic system 900 may include a processor 910, an input/output device 930, and a memory chip 920, which may perform data communication with each other via a bus 940. The processor 910 may execute a program and may control the electronic system 900. The input/output device 930 may be used to input or output data of the electronic system 900. The electronic system 900 is connected to an external apparatus, for example, a personal computer or a network, using the input/output device 930, to send/receive data to/from the external apparatus. The memory chip 920 may store codes and/or data for operating the processor 910 and/or may store data processed by the processor 910. For example, the memory chip 920 may include a vertical structure non-volatile memory device as illustrated in FIG. 2.

The electronic system 900 may constitute various electronic control devices that use the memory chip 920 and can be used for a mobile phone, an MP3 player, a navigation system, a portable multimedia player (PMP), a solid state disk (SSD), or a household appliance.

While the inventive concept has been particularly shown and described with reference to exemplary embodiments thereof, it will be understood that various changes in form and details may be made therein without departing from the spirit and scope of the following claims.

What is claimed is:

1. A method of manufacturing a vertical structure non-volatile memory device, the method comprising:
    forming a first sacrificial layer on a substrate;
    alternately stacking insulating layers and second sacrificial layers having different etch selectivities with respect to the first sacrificial layer, on the first sacrificial layer;
    forming a first middle opening for exposing the first sacrificial layer through the second sacrificial layers and the insulating layers;
    forming a first opening having sidewalls for exposing a first portion of the substrate, by etching the first exposed sacrificial layer;
    forming a gate dielectric layer on sidewalls and a bottom surface of the first opening;
    forming a channel layer that is electrically connected to the substrate, on the gate dielectric layer;
    forming a second opening to be separated from the first opening, the second opening exposing a second portion of the substrate through the insulating layers and the first sacrificial layer;
    removing the second sacrificial layers exposed through the second opening;
    removing the first sacrificial layer exposed through the second opening; and
    filling a conductive material layer in a space formed by removing the first sacrificial layer and the second sacrificial layers.

2. The method of claim 1, wherein the substrate comprises a surface layer comprising a middle temperature oxide (MTO) buffer layer.

3. The method of claim 1, wherein the first sacrificial layer is formed of polysilicon, and the second sacrificial layers are formed of nitride layers or oxide layers, and the insulating layers are formed of oxide layers or nitride layers having different etch selectivities with respect to the first sacrificial layer and the second sacrificial layers.

4. The method of claim 1, wherein the first sacrificial layer is removed using a halogen-containing reaction gas.

5. The method of claim 4, wherein the halogen-containing reaction gas comprises at least one gas selected from the group consisting of $Cl_2$, $NF_3$, $ClF_3$, and $F_2$ gases.

6. The method of claim 1, wherein the first sacrificial layer is removed by performing a plasma-less thermal etch process.

7. The method of claim 6, wherein the plasma-less thermal etch process is performed at a temperature lower than 500° C.

8. The method of claim 1, wherein the first sacrificial layer is removed by performing a plasma-less thermal etch process using a halogen-containing reaction gas.

9. The method of claim 1, wherein a bottom surface of the gate dielectric layer forms the same plane as a top surface of the substrate.

10. The method of claim 9, wherein the first sacrificial layer is removed by performing a plasma-less thermal etch process using a halogen-containing reaction gas.

11. The method of claim 1, wherein the forming of the channel layer comprises:
    forming a first semiconductor material layer on the gate dielectric layer;
    forming a spacer on sides of the first semiconductor material layer;
    exposing the substrate by etching bottom surfaces of the first semiconductor material layer and the gate dielectric layer by using the spacer as a mask;
    removing the spacer; and forming a second semiconductor material layer for connecting the first semiconductor material layer and the substrate.

12. The method of claim 11, wherein the first sacrificial layer is removed by performing a plasma-less thermal etch process using a halogen-containing reaction gas.

13. The method of claim 1, wherein the forming of the channel layer comprises:
   forming a first semiconductor material layer on the gate dielectric layer;
   exposing the substrate by anisotropically etching bottom surfaces of the first semiconductor material layer and the gate dielectric layer; and
   forming a second semiconductor material layer for connecting the first semiconductor material layer and the substrate.

14. The method of claim 13, wherein the first sacrificial layer is removed by performing a plasma-less thermal etch process using a halogen-containing reaction gas.

15. The method of claim 1, wherein the forming of the second opening comprises etching an upper portion of the substrate by over etching, and the conductive material layer is formed of a metallic material, and the conductive material layer filled in a space formed by removing the first sacrificial layer, is a gate of a ground selection transistor.

16. The method of claim 15, wherein the first sacrificial layer is removed by performing a plasma-less thermal etch process using a halogen-containing reaction gas.

17. A method of manufacturing a memory device comprising:
   forming a first sacrificial layer on a top surface of a substrate;
   alternately stacking insulating layers and second sacrificial layers on the first sacrificial layer;
   forming a first opening having sidewalls and exposing a first portion of the substrate, wherein the first portion of the substrate is a bottom surface of the first opening;
   forming a gate dielectric layer on the sidewalls and the bottom surface of the first opening;
   forming a channel layer that is electrically connected to the substrate, on the gate dielectric layer;
   forming a second opening to be separated from the first opening, the second opening exposing a second portion of the substrate through the insulating layers and the first sacrificial layer; and
   replacing the first and second sacrificial layers with a conductive material layer.

18. The method of claim 17, wherein the top surface of the substrate comprises a middle temperature oxide (MTO) buffer layer.

19. The method of claim 17, wherein a bottom surface of the gate dielectric layer is in the plane of the top surface of the substrate.

* * * * *